United States Patent
Beck et al.

(10) Patent No.: US 12,176,766 B2
(45) Date of Patent: Dec. 24, 2024

(54) EMC FILTER COMPONENT WITH DC-LINK WITH IMPROVED ATTENUATION, SEMICONDUCTOR COMPONENT AND DC-LINK EMC SYSTEM

(71) Applicant: TDK Electronics AG, Munich (DE)

(72) Inventors: Fabian Beck, Rüttenen (CH); Karl Niklas, Königsbronn-Itzelberg (DE); Wolfgang Rambow, Essen (DE)

(73) Assignee: TDK Electronics AG, Munich (DE)

( * ) Notice: Subject to any disclaimer, the term of this patent is extended or adjusted under 35 U.S.C. 154(b) by 278 days.

(21) Appl. No.: 17/642,518

(22) PCT Filed: Mar. 24, 2021

(86) PCT No.: PCT/EP2021/057541
§ 371 (c)(1),
(2) Date: Mar. 11, 2022

(87) PCT Pub. No.: WO2021/197956
PCT Pub. Date: Oct. 7, 2021

(65) Prior Publication Data
US 2022/0337130 A1  Oct. 20, 2022

(30) Foreign Application Priority Data
Mar. 31, 2020 (DE) .......................... 102020108879.5

(51) Int. Cl.
*H02K 11/02* (2016.01)
*B60R 16/033* (2006.01)
*H03H 7/01* (2006.01)

(52) U.S. Cl.
CPC ............ *H02K 11/02* (2013.01); *B60R 16/033* (2013.01); *H03H 7/0138* (2013.01)

(58) Field of Classification Search
CPC .. H01R 13/66; H01R 13/6625; H01R 13/665; H02K 11/02; H03H 7/0138
(Continued)

(56) References Cited

U.S. PATENT DOCUMENTS 8,764,415 B2   7/2014  Hattori et al.
10,389,327 B2 * 8/2019  Kochetov ................ H04B 3/30
(Continued)

FOREIGN PATENT DOCUMENTS

DE   102008039133 A1   10/2009
DE   102016110742 A1   12/2017
(Continued)

OTHER PUBLICATIONS

A Schwab, et al., "Passive interference suppression components," Electromagnetic Compatibility; [Vdi-[Book]], Springer Verlag, Heidelberg, Jan. 1, 2011, 43 pages.

*Primary Examiner* — Hai L Nguyen
(74) *Attorney, Agent, or Firm* — Slater Matsil, LLP

(57) ABSTRACT

In an embodiment an EMC filter component includes a first interface, a second interface, a filter circuit, a mechanical connection and a DC-Link capacitor as a circuit element, wherein the filter circuit is electrically connected between the first interface and the second interface, wherein the mechanical connection is configured for mechanically connecting the EMC filter component to an external mounting location, and wherein the mechanical connection is configured for electrically connecting the filter circuit to a ground potential of the external mounting location.

18 Claims, 5 Drawing Sheets

(58) Field of Classification Search
USPC .............. 333/181, 186; 439/620.01, 620.09, 439/620.13
See application file for complete search history.

(56) References Cited

U.S. PATENT DOCUMENTS

| | | | |
|---|---|---|---|
| 10,692,655 | B2 | 6/2020 | Beck et al. |
| 11,910,523 | B2 * | 2/2024 | Beck ..................... H02M 1/44 |
| 2009/0246047 | A1 | 10/2009 | Hattori et al. |
| 2015/0263694 | A1 | 9/2015 | Sun |
| 2019/0267193 | A1 | 8/2019 | Beck et al. |

FOREIGN PATENT DOCUMENTS

| | | | |
|---|---|---|---|
| DE | 202019106744 | U1 | 12/2019 |
| DE | 102018216286 | A1 | 3/2020 |
| JP | S5969641 | U | 5/1984 |
| JP | H0898529 | A | 4/1996 |
| JP | 2018121406 | A | 8/2018 |
| WO | 0219475 | A1 | 3/2002 |

\* cited by examiner

EMC FILTER COMPONENT WITH DC-LINK WITH IMPROVED ATTENUATION, SEMICONDUCTOR COMPONENT AND DC-LINK EMC SYSTEM

This patent application is a national phase filing under section 371 of PCT/EP2021/057541, filed Mar. 24, 2021, which claims the priority of German patent application 102020108879.5, filed Mar. 31, 2020, each of which is incorporated herein by reference in its entirety.

TECHNICAL FIELD

The present invention refers to EMC filter components with improved noise level, e.g. with increased attenuation, to a semiconductor component that can be connected to the EMC filter component and to a corresponding DC-Link EMC system that can comprise an EMC filter component and a semiconductor component.

BACKGROUND

EMC filters (EMC=electromagnetic compatibility) can be used to reduce or eliminate unwanted contributions of electric or electronic components such that an electromagnetic component can be used together with one or several other electric or electronic components or in the vicinity of other electric components.

For example, electric motor drives can be the source of such unwanted emissions that should be reduced or eliminated to avoid unwanted interference with other circuit components. To that end, an EMC filter can be electrically connected, e.g. between a power source and an electric motor drive.

For example, in electrically driven vehicles a battery provides electrical energy to an electric motor drive. The battery provides a DC (direct current) current at a specific voltage. When the electric motor drive needs another form of electrical energy, e.g. AC (alternating current) or another voltage then an inverter can be employed to convert electric energy of a battery such that it can be well utilized by an electric motor drive. However, inverters can also be the source of unwanted emissions. Correspondingly, an EMC filter can be used to reduce or eliminate unwanted emissions from the inverter.

The performance of an EMC filter is characterized by the reduction of the unwanted emissions, i.e. the amount of noise provided at the output of the EMC filter.

SUMMARY OF THE INVENTION

Embodiments provide an EMC filter with a reduced noise level at its output side.

The EMC filter component comprises a first interface, a second interface, a filter circuit and a mechanical connection. The filter circuit is electrically connected between the first interface and the second interface. The mechanical connection is provided to and configured for mechanically connecting the component to an external mounting location. The mechanical connection is also provided to and configured for electrically connecting the filter circuit to ground potential of the external mounting location.

The present EMC filter component is based on the idea of providing an improved ground connection to reduce the noise level provided at an output side of the EMC filter component. Conventional EMC filter components have separate connections in addition to a power connection where the separate connection is dedicated to be connected to a ground potential of the environment of the EMC filter component.

Obviously, the intuitive approach to enhance the attenuation by improving the ground connection would be to extend the separate ground connection, e.g. by adding parallel shunt paths to ground. Thus, the intuitive approach would be to increase the number of ground connections and conductors to a ground potential compared to conventional EMC filter components.

Thus, the approach suggested by the present EMC filter component is counterintuitive because instead of increasing the number of ground connectors and enhancing efforts by providing additional ground conductors, the number of specifically dedicated ground conductors is reduced. Specifically, ground conductors dedicated only to providing a ground connection are completely eliminated. Instead, a mounting connection to another circuit component and using the other circuit component's ground connection is suggested.

However, although a common understanding of the omission of specifically dedicated ground connections should lead to a deterioration of the ground connection of the component, it was found that an improved ground connection can be obtained which results in a reduced noise level. A cause for this surprising effect is that the resulting ground connection can have shorter effective connector lengths. Thus, a reduction in effort for obtaining ground connection results in a need for less space, smaller components, reduced conductor material and improved performance.

In the EMC filter component the first interface can comprise the electrical connections to an electrical component from which the EMC filter obtains electric energy. The second interface can comprise electrical connections via which the EMC filter component provides electric power— with a reduced noise level and a reduced amount of unwanted emissions—to an external circuit environment. Specifically, the first interface can be provided to and configured for connecting the EMC filter component with a battery or with an inverter electrically connected between a battery and the EMC filter component. The second interface can be used to electrically connect the EMC filter component to an electric motor drive, e.g. of an electric vehicle.

The filter circuit of the EMC filter component can comprise filter elements such as active or passive filter elements such as inductance elements, resistance elements and/or capacitance elements that build a filter network. Conventional filter network topologies are possible for the present EMC filter component. The external mounting location is arranged within the direct vicinity of the EMC filter component. The mechanical connection can be used to mount the EMC filter component in a mechanically stable configuration such that vibrations or inertial forces cannot reposition the EMC filter component. The external mounting location can be a mounting location of a further electrical component in the vicinity of the EMC filter component. Specifically, it is possible that the external mounting location is a mounting location at an electrical component to which the EMC filter component is directly connected, for example, a battery, an inverter or an electric motor drive.

It is possible that the EMC filter component further comprising a DC-Link capacitor as a circuit element.

It is possible that the external mounting location is a mounting location of a component, e.g. a semiconductor component, e.g. an inverter, providing a ground potential to the EMC filter component.

Thus, the mechanical connection is a dual purpose connection providing a mechanically stable connection and an electrical connection to a ground potential with a short effective conductor length.

It is possible that the mechanical connection comprises or consists of a material selected from an electrically conducting material, a metal and an alloy.

Specifically, the electrically conducting material can comprise or consist of copper, aluminium, silver, gold or an alloy thereof.

It is possible that the mechanical connection has an elongated shape that has an extension directed away from the component.

The component can have a housing or a chassis in which the electrical elements of the filter circuits are arranged. In order to provide an electrical and a mechanically stable connection to the environment of the EMC filter component, the elongated shape and the extension directed away from the component's housing or chassis ensures the shortest possible connection to the external mounting location.

It is possible that the elongated shape has a section along the extension direction with a uniform cross section.

It is possible that the elongated shape has a cross section that can be selected from a quadratic cross section, a rectangular cross section, a circular cross section and an elliptical cross section or other shapes, e.g. an L-shape that provide the possibility for mechanical and electrical connection.

Further, it is possible that the mechanical connection has a distal end that comprises a flat section where the flat section has a hole.

In this respect the distal end of the mechanical connection is the end of the mechanical connection opposed to the end that directly attaches the connection to the other elements of the EMC filter component.

The provision of a flat section of the mechanical connection ensures that a large contact area to a corresponding connection end of the external mounting location is provided.

The provision of a hole in the flat section ensures that—utilizing a bolt and nuts, for example—a mechanically stable connection can be ensured.

It is possible that the mechanical connection comprises one, two, three or more pieces.

Each piece of the mechanical connection provides a separate mechanically stable connection and an electrical connection with a short effective conductor length. Each of the pieces can have a similar construction, e.g. with an elongated shape pointing away from the body of the filter component and comprising a flat distal end section with a hole.

It is possible that all pieces of the mechanical connection—at least associated with one of the two interfaces—are arranged at the same side of the component.

This ensures short conductor lengths and mechanically stable connections.

Further, it is possible that pure electrical connections are arranged—at least in a horizontal plane between pieces of the mechanical connection—between two of the pieces of the mechanical connection.

It is possible that the first interface is provided to and configured for an electrical connection to a component selected from a further electrical component, a semiconductor component, an inverter, a battery, an electric motor drive.

It is possible that the first interface comprises one, two, three or more connections for connection to a first potential and one, two, three or more connections to be connected to a second potential. It is possible that the first potential and the second potential are different from a ground potential.

Similarly, it is possible that the second interface is provided to and configured for an electrical connection to a component selected from a further electrical component, a semiconductor component, an inverter, a battery, an electrical motor drive.

In this respect, the electric motor can also be thought of as an electric generator.

It is possible that the EMC filter component further comprises a second mechanical connection at the side of the second interface. Similarly to the above description, the second mechanical connection can be provided to and configured for mechanically connecting the component to a second external mounting location. The second mechanical connection can also be provided to and configured for electrically connecting the filter component to a ground potential of the second external mounting location.

Thus, it is possible that the second interface comprises one, two, three or more connections for a first potential, one, two, three or more connections for a second potential and one, two, three or more connections for a ground potential.

In this respect the electrical connections can be connections of the first and/or second interface, respectively.

It is further possible that the filter circuit comprises resistance elements, capacitance elements and inductance elements as circuit elements.

It is possible that two inductance elements of the filter circuit are magnetically coupled.

In a first embodiment of the EMC filter component the EMC filter comprises two power lines. In each power line two inductance elements are electrically connected in series. Each of the inductance elements is magnetically coupled to a corresponding inductance element of the respective other power line. Three capacitance elements can be electrically connected between the two power lines. The first interface can comprise three connections electrically connected to one of the two power lines and three other connections electrically connected to the respective other power lines.

Further, the first interface comprises a first piece and a second piece of the mechanical connection. Further, each of the two mechanical connections of the first interface is electrically coupled to one of the two power lines of the filter. Specifically, the coupling can be performed by a serial connection of a resistance element and a parallel connection of two capacitance elements. The parallel connection of the capacitance elements can establish Y2-Class safety capacitors, i.e. safety capacitors with a pulse capability up to a voltage of 5000 V.

Further, at the second interface the EMC filter component can have a first connection electrically connected to the first power line and a second connection electrically connected to the second power line and an additional ground connection, e.g. via a mechanical connection as described above at the side of the second interface. The ground connection can be electrically connected to each of the two power lines with a respective series connection of a resistance element and a capacitance element. The capacitance elements correspondingly also can establish Y2-Class safety capacitors.

In a second embodiment the first interface differs from the first interface described above in that only one mechanical connection is present. This one mechanical connection is electrically connected to each of the two power lines via a series connection of a parallel connection of two capacitance elements and a resistance element, respectively.

A DC-Link EMC system can comprise an EMC filter component as described above and a semiconductor component as described below. The EMC filter component and the semiconductor component can be electrically and mechanically connected to one another via their mechanical connections.

The semiconductor component establishes a possibility of the further electrical component being electrically and mechanically connected to the EMC filter component. The semiconductor component can also comprise a first interface, a second interface and a semiconductor circuit together with a mechanical connection. The semiconductor circuit is electrically connected between the first interface and the second interface. The mechanical connection is provided to and configured for mechanically connecting the component to an external mounting location, e.g. of the EMC filter component. The mechanical connection is also provided to and configured for electrically connecting the semiconductor circuit to a mechanical connection of an EMC filter component.

It is possible that the semiconductor component is an inverter. Thus, the semiconductor circuit of the semiconductor component comprises the corresponding semiconductor switches and further circuitry needed for establishing the inverter function, e.g. for converting electric energy provided by a battery to electric energy needed by an electric motor drive.

It is possible to use a component, e.g. the filter component or the semiconductor component or the system comprising the semiconductor component and the filter component in a system selected from an electrical system and the electrical system of a vehicle. Specifically, it is possible to use the corresponding components or the system of components between a battery and an electric motor drive.

BRIEF DESCRIPTION OF THE DRAWINGS

Central working principles and details of preferred embodiments are shown in the accompanying schematic figures.

DETAILED DESCRIPTION OF ILLUSTRATIVE EMBODIMENTS

Figure 1:
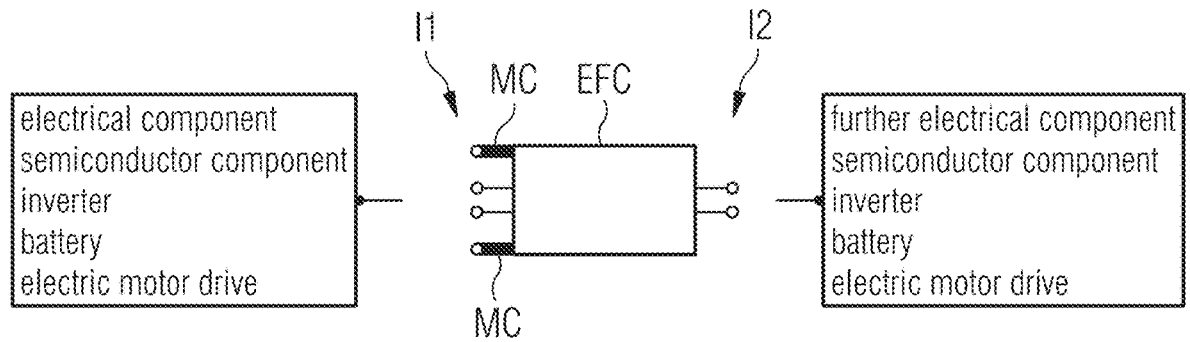
FIG. 1 shows basic elements of the EMC filter component EFC.

FIG. 1 illustrates basic elements of the EMC filter component EFC. The filter component EFC comprises a first interface I1 and a second interface I2. At the side of the first interface I1 mechanical connections MC are arranged. The mechanical connections MC are created with a mechanical strength sufficient for solidly mounting the EMC filter component EFC to external mounting locations. In addition, the mechanical connections MC further provide an electric functionality because the mechanical connections MC are provided to and configured for electrically connecting the EMC filter component to a ground potential of the external mounting location.

In FIG. 1 the first interface, thus, comprises two pure electrical connections arranged between the mechanical connections MC and the two further dual purpose mechanical connections MC for mechanically and electrically connecting the component EFC to an external circuit environment.

On the respective other side, the second interface I2 comprises electrical connections that are dedicated for propagating electric power to or from the filter component.

Of course, the provision of mechanical connections MC as provided at the first interface I1 is also possible at the second interface I2.

Figure 2:
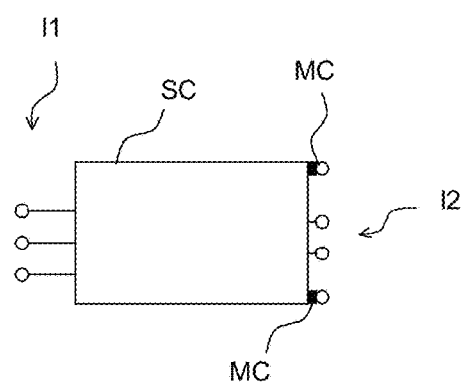
FIG. 2 shows basic elements of the semiconductor circuit SC.

Correspondingly, FIG. 2 illustrates basic elements of the circuit component that is dedicated to be connected to the EMC filter component EFC as shown in FIG. 1. As an example only, the component can be a semiconductor component SC which has mechanical connections MC at the second interface I2 in addition to electrical connections at the second interface I2. The semiconductor component SC has further electrical connections at the first interface I1.

Figure 3:
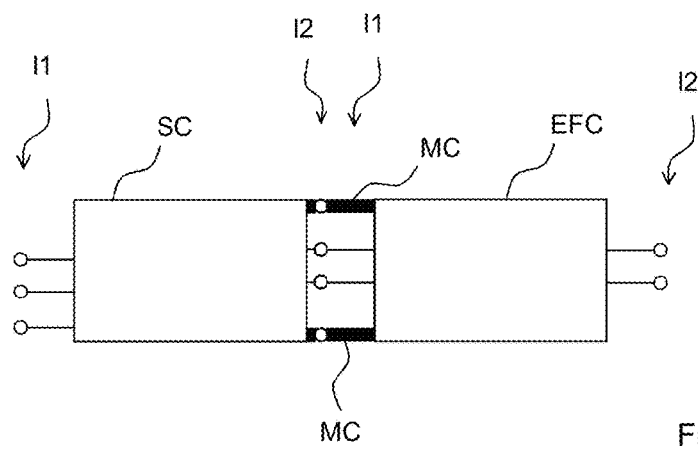
FIG. 3 shows a system comprising the semiconductor component SC and the EMC filter component EFC.

FIG. 3 shows a system comprising the semiconductor component SC of FIG. 2 electrically and mechanically connected to the EMC filter component as shown in FIG. 1. The mechanical connections MC of the EMC filter component EFC are mechanically and electrically connected to corresponding mechanical connections MC of the semiconductor component SC. Specifically, the first interface I1 of the EMC filter component EFC is electrically and mechanically connected to the second interface I2 via mechanical connections.

It is possible for the component shown in the present application that a first interface is an interface electrically configured to receive electric energy from an external circuit environment while a second interface is an interface provided for forwarding electric energy to other elements of the electric circuit environment. Correspondingly, the semiconductor circuit can receive electric energy at its first interface I1 and provides electric energy to the EMC filter component EFC at its second interface I2 while the EMC filter component EFC receives the electric energy at its first interface I1 and provides electric energy, e.g. to a motor drive, via its second interface I2.

It is possible that the semiconductor circuit SC has a good connection to a ground potential of the circuit environment of the system. In this case, the mechanical connection MC can be utilized to also use the ground connection of the semiconductor component for the circuit components of the EMC filter component EFC, such that efforts to create a separate ground connection at the side of the EMC filter component are not necessary, while improving the performance of the EMC filter component.

The number of connections per interface can be 2 (as shown in FIG. 2) or 3 (as shown with respect to the first interface in FIG. 2) or higher. When the number of connections is 3 then the interface can be configured to handle a 3-phase power signal.

Figure 4:
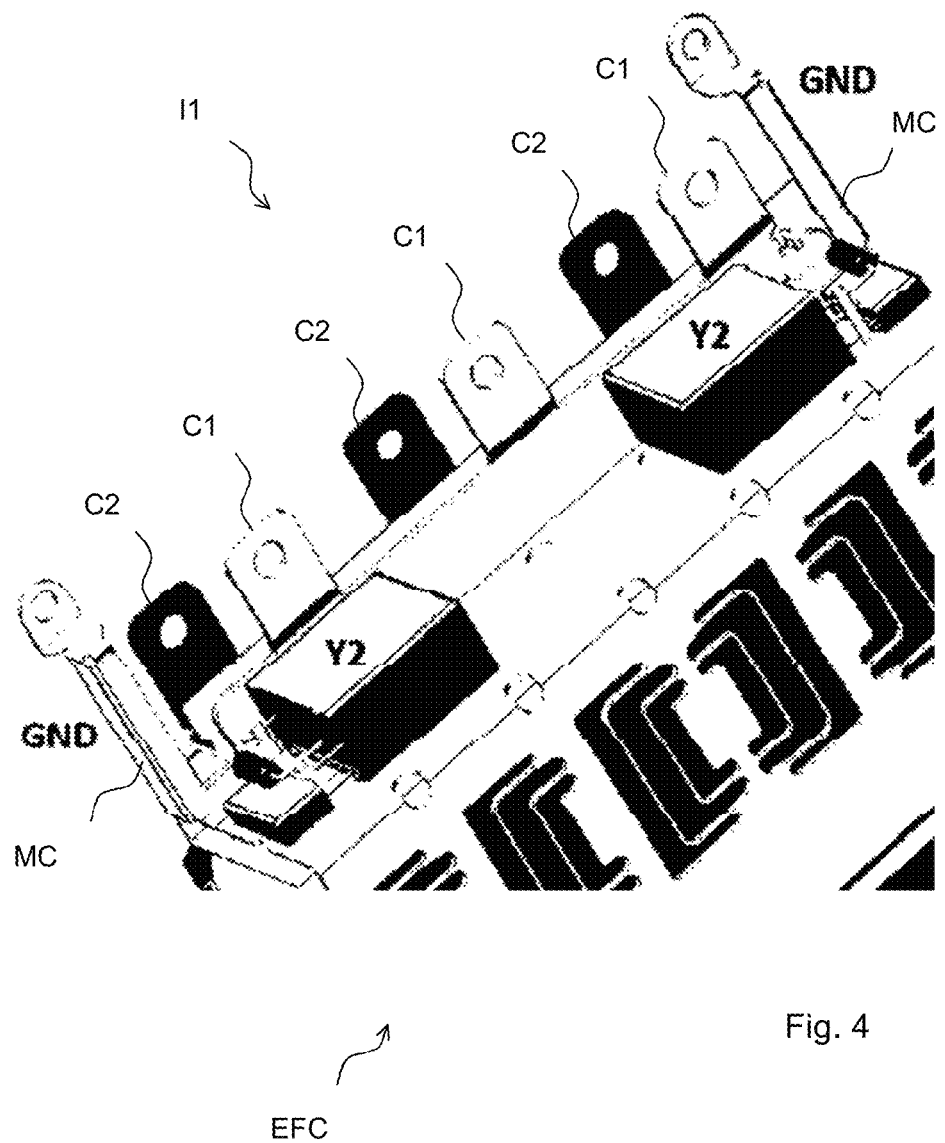
FIG. 4 shows a perspective view of the first interface of the EMC filter component EFC.

FIG. 4 illustrates a perspective view of the side of the housing of the EMC filter component EFC where the connections of the first interface I1 are arranged. Specifically, the first interface can comprise a first piece of the mechanical connection MC and a second piece of the mechanical connection MC where the two pieces are arranged at opposite sides of the body of the filter component EFC. Between the two pieces of the mechanical connection MC the first interface comprises three connections C1, dedicated for being electrically connected to a first electrical potential, and three further electrical connections C2, dedicated for being connected to a second electrical potential. Further, the component has one compartment housing Y2 capacitors at the side of the corresponding piece of the mechanical connection MC. The pieces of the mechanical connection themselves have an elongated shape pointing away from the body of the filter component EFC. The elongated portion has a section with a rectangular or quadratic cross section. Distal ends of the pieces have a flat section with a hole that allows an easy to perform, but stiff, connection via bolts and nuts.

For each of the connections C1, C2 of the interface and for each of the pieces of the mechanical connection MC a corresponding counter element is provided at the side of the component having the external mounting location such that good electrical and mechanical connection is obtained.

In this respect it should be noted that the connections C1, C2 that provide an electrical connection could also provide a certain degree of mechanical stability when connected to their corresponding counterparts. However, the mechanical stability of the connection via the mechanical connections is substantially stronger, e.g. by a factor of 2, 5 or 10 with respect to pulling forces or shearing forces.

Figure 5:
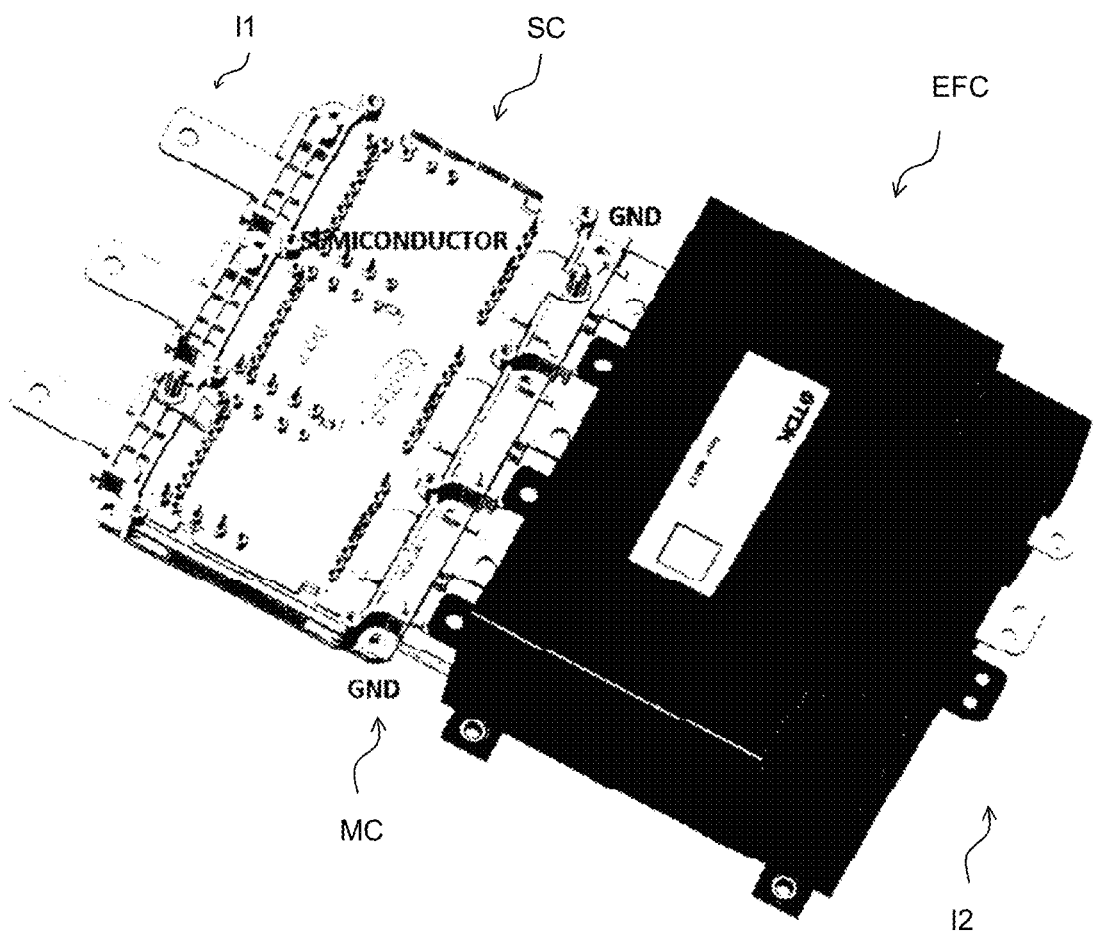
FIG. 5 shows a perspective view of the system comprising the semiconductor component and the filter component.

FIG. 5 shows a perspective view of the system comprising the EMC filter component EFC at one side and the semiconductor component SC on the respective other side.

The semiconductor component also has a first interface I1 for receiving electric power and the filter component EFC has a corresponding second interface I2 for providing electric power.

Figure 6:
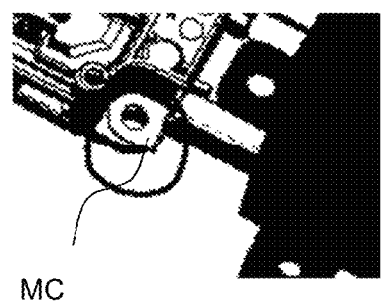
FIG. 6 shows an enlarged view of the actual contact area of the mechanical connection.

FIG. 6 illustrates an enlarged view of the connection area of the mechanical connection MC of one of the pieces shown in FIG. 5. A flat surface of the distal end of the mechanical connection of the filter component is in direct contact with the corresponding flat surface of a mechanical connection MC of the semiconductor component. Each of the corresponding distal ends has a hole. The mounting is performed such that the holes overlap with respect to their position such that a common bolt can be used to be inserted in the common hole of the mechanical connection.

Figure 7:
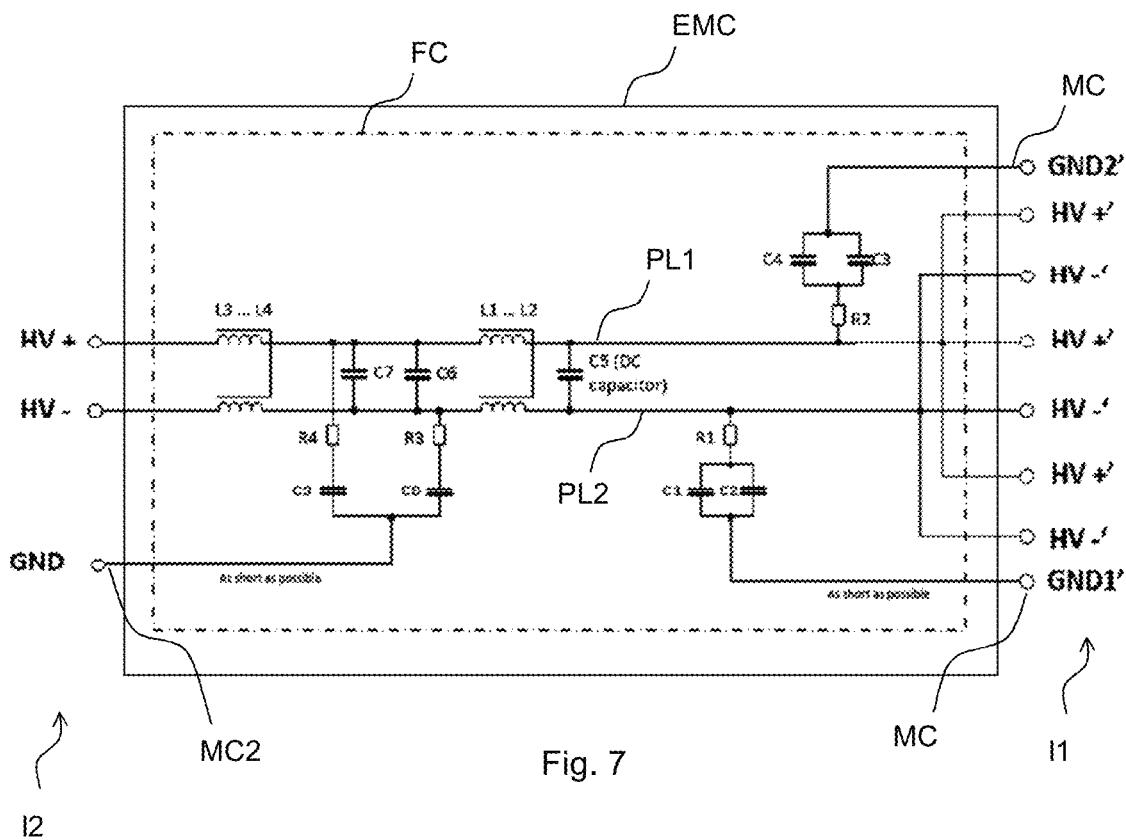
FIG. 7 shows an equivalent circuit diagram of one possible filter circuit.

FIG. 7 shows an equivalent circuit diagram of one embodiment of the filter circuit FC. The filter circuit FC has a first power line PIA and a second power line PL2. The first power line PIA electrically connects a connection of the second interface I2 to three connections of the first interface. The second power line PL2 electrically connects a respective other connection of the second interface I2 to three connections of the first interface I1 Each power line comprises two inductance elements electrically connected in series to one another. Each inductance element is magnetically coupled to an inductance element of the respective other power line. Further, three capacitance elements C5, C6, C7 electrically connect the two power lines PL1, PL2 to one another. A ground connection GND established by a mechanical connection MC2 of the second interface I2 is electrically connected to the first power line via a series connection of a capacitance element C9 and a resistance element R4 and to the second power line PL2 via a series connection of a capacitance element C8 and a resistance element R3.

At the side of the first interface I1 a first piece and a second piece of the mechanical connection MC are arranged. The first piece is electrically connected with the first power line PIA via a series connection. The series connection comprises a resistance element R2 and a parallel connection of capacitance elements C3 and C4 which establish a Y2-Class safety capacitor. Further, the respective second piece of the mechanical connection MC is electrically connected to the second power line PL2 via a series connection. The series connection comprises the resistance element R1 and a parallel connection of two capacitance elements C1, C2 also establishing a Y2-Class safety capacitor.

The provision of the ground connection via the very short conductors reduces effort in ground connection, reduces spatial area needed for the component and enhances the performance of the filter component.

Figure 8:
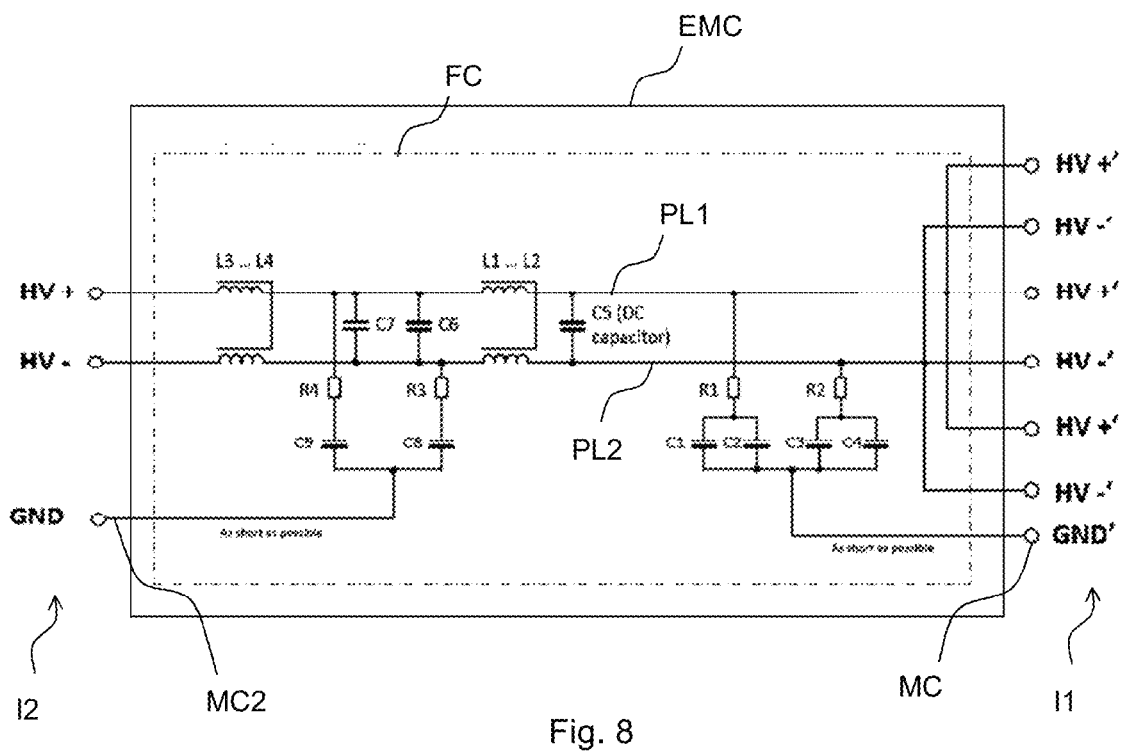
FIG. 8 shows an alternative equivalent circuit diagram of the filter circuit FC.

An alternative possibility for the filter circuit FC is shown in FIG. 8. The circuitry for the filter functionality and the circuitry at the side of the second interface corresponds to that shown in FIG. 7. However, the component shown in FIG. 8 has only one piece of the mechanical connection MC. This piece is electrically connected to the second power line PL2 via a series connection that consists of a resistance element R2 and the parallel connection of the capacitance elements C3 and C4. The connection between the piece of the mechanical connection MC and the first power line PIA is established via a series connection of a resistance element R1 and a parallel connection of capacitance elements C1, C2.

Figure 9:
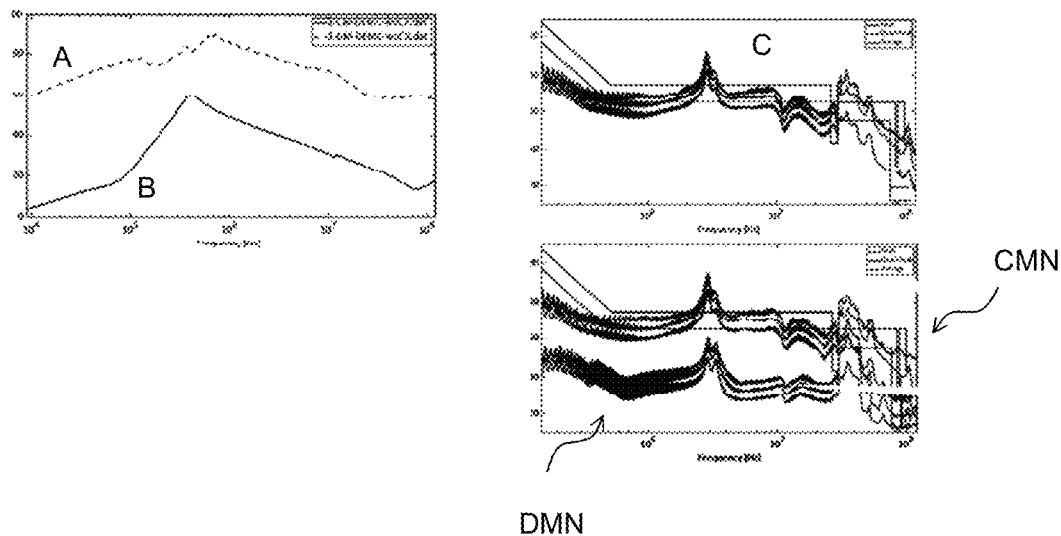
FIG. 9 illustrates the performance of an EMC filter component with conventional ground connections.
Figure 10:
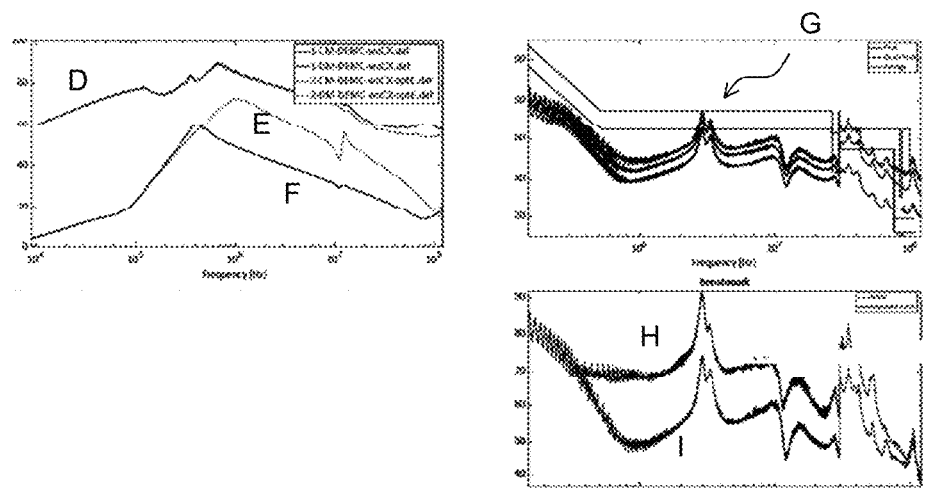
FIG. 10 shows a comparison between the performance levels of the conventional component and the improved EMC filter component.

FIGS. 9 and 10 illustrate the electrical performance of conventional EMC filter components compared to improved EMC filter components as described above. In particular, the upper left portion of FIG. 9 shows (curve A) a differential mode attenuation and (curve B) a typical common mode attenuation.

The upper right of FIG. 9 shows in curves C typical noise from a filtered motor drive.

The lower right portion of FIG. 9 shows the common mode noise CMN with respect to the ground potential and the differential mode noise DMN as noise between the potential for a typical noise, respectively.

In contrast, the upper left of FIG. 10 shows (curve D) the differential mode attenuation, a common mode attenuation (curve F) with a not optimized ground connection and (curve E) the common mode attenuation of an improved ground connection as described above.

The upper right portion of FIG. 10 shows (peaks of curves G) typical noise of an inverter system with a filter.

The lower right portion of FIG. 10 illustrates the performance differences with respect to the noise level. Specifically at an operation frequency of 400 KHz the improved EMC filter component (curve I)— due to its counterintuitive but effective ground connections—have a noise level reduced by approx. 20 dB compared to the noise level (curve H) without the filter described above.

Although the invention has been illustrated and described in detail by means of the preferred embodiment examples, the present invention is not restricted by the disclosed examples and other variations may be derived by the skilled person without exceeding the scope of protection of the invention.

The invention claimed is:

1. An EMC filter component comprising:
   a first interface;
   a second interface;
   a filter circuit;
   a mechanical connection; and a DC-Link capacitor as a circuit element,
wherein the filter circuit is electrically connected between the first interface and the second interface,
wherein the mechanical connection is configured for mechanically connecting the EMC filter component to an external mounting location,
wherein the mechanical connection is configured for electrically connecting the filter circuit to a ground potential of the external mounting location,
wherein the first interface comprises electrical connections,
wherein the mechanical connection comprises at least two pieces, and
wherein the electrical connections are arranged in a horizontal plane between the two pieces of the mechanical connection.

2. The EMC filter component of claim 1, wherein the external mounting location is a mounting location of a semiconductor component configured to provide the ground potential to the EMC filter component.

3. The EMC filter component of claim 1, wherein the mechanical connection comprises a material selected from an electrically conducting material, a metal or an alloy.

4. The EMC filter component of claim 1, wherein the mechanical connection has an elongated shape that has an extension directed away from the EMC filter component.

5. The EMC filter component of claim 4, wherein the elongated shape has a section along the extension direction with a uniform cross section.

6. The EMC filter component of claim 4, wherein the elongated shape has a cross section selected from a quadratic cross section, a rectangular cross section, a circular cross section, or an elliptical cross section.

7. The EMC filter component of claim 1, wherein the mechanical connection has a distal end that comprises a flat section with a hole.

8. The EMC filter component of claim 1, wherein the mechanical connection comprises three or more pieces.

9. The EMC filter component of claim 8, wherein all pieces of the mechanical connection are arranged at the same side of the EMC filter component.

10. The EMC filter component of claim 9, wherein the first interface is configured for an electrical connection to a component selected from a further electrical component, a semiconductor component, an inverter, a battery or an electric motor drive.

11. The EMC filter component of claim 1, wherein the first interface comprises 1, 2, 3 or more connections to be connected to a first potential and 1, 2, 3 or more connections for connection to a second potential.

12. The EMC filter component of claim 1, wherein the second interface is configured for an electrical connection to a component selected from a further electrical component, a semiconductor component, an inverter, a battery or an electric motor drive.

13. The EMC filter component of claim 1, further comprising:
a second mechanical connection at a side of the second interface,
wherein the second mechanical connection is configured for mechanically connecting the EMC filter component to a second external mounting location, and
wherein the second mechanical connection is also configured for electrically connecting the filter circuit to a ground potential of the second external mounting location.

14. The EMC filter component of claim 1, wherein the second interface comprises 1, 2, 3 or more connections for a first potential, 1, 2, 3 or more connections for a second potential, 1, 2, 3 or more connections for the ground potential.

15. The EMC filter component of claim 1, wherein the filter circuit comprises resistance elements, capacitance elements and inductance elements.

16. The EMC filter component of claim 15, wherein two inductance elements are magnetically coupled.

17. A DC-Link EMC system comprising:
the EMC filter component of claim 1; and
a semiconductor component,
wherein the EMC filter component and the semiconductor component are electrically and mechanically connected to one another via their mechanical connections.

18. A system comprising:
the EMC filter component of claim 1;
a battery; and
an electric motor drive,
wherein the system is an electrical system of a vehicle, and
wherein the EMC filter component is located between the battery and the electric motor drive.

* * * * *